US012776617B2

(12) United States Patent
Kainuma

(10) Patent No.: US 12,776,617 B2
(45) Date of Patent: Oct. 27, 2026

(54) STEM FOR SEMICONDUCTOR PACKAGE AND SEMICONDUCTOR PACKAGE

(71) Applicant: SHINKO ELECTRIC INDUSTRIES CO., LTD., Nagano (JP)

(72) Inventor: Masao Kainuma, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 685 days.

(21) Appl. No.: 18/297,844

(22) Filed: Apr. 10, 2023

(65) Prior Publication Data

US 2023/0344193 A1 Oct. 26, 2023

(30) Foreign Application Priority Data

Apr. 21, 2022 (JP) ................................. 2022-069993

(51) Int. Cl.
*H01S 5/0231* (2021.01)
*H01S 5/0239* (2021.01)
*H01S 5/024* (2006.01)

(52) U.S. Cl.
CPC .......... *H01S 5/0231* (2021.01); *H01S 5/0239* (2021.01); *H01S 5/02469* (2013.01)

(58) Field of Classification Search
CPC .. H01S 5/0231; H01S 5/0239; H01S 5/02469; H01S 5/02415; H01S 5/02212; H01S 5/02345; H01S 5/02208; H01S 5/02315; H01S 5/02407; H01L 23/045; H01L 23/38; H01L 23/49811
See application file for complete search history.

(56) References Cited

U.S. PATENT DOCUMENTS 11,128,101 B2 * 9/2021 Hettler .................. H01S 5/0235
2009/0316745 A1 * 12/2009 Fukamachi ............... H01S 5/18 372/50.21
2016/0020577 A1 * 1/2016 Sakai .................. H01S 5/02212 362/382
2020/0227887 A1 * 7/2020 Katayama ........... H01S 5/02212
2022/0201863 A1 * 6/2022 Noguchi ............... H01S 5/0239

FOREIGN PATENT DOCUMENTS

JP S61-003452 1/1986
JP 2006-041085 2/2006
JP 2017-212252 11/2017

OTHER PUBLICATIONS

Office Action mailed on Dec. 23, 2025 issued with respect to the basic Japanese patent application No. 2022-069993.

* cited by examiner

*Primary Examiner* — Xinning(Tom) Niu
(74) *Attorney, Agent, or Firm* — IPUSA, PLLC

(57) ABSTRACT

A stem for a semiconductor package includes an eyelet including a flat plate having a first surface and a second surface opposite to the first surface, a cavity opening to the first surface of the flat plate, and a metal block protruding from the second surface of the flat plate, and a lead extending through the flat plate from the first surface to the second surface, wherein a volume of the metal block is substantially the same as a volume of the cavity.

9 Claims, 7 Drawing Sheets

STEM FOR SEMICONDUCTOR PACKAGE AND SEMICONDUCTOR PACKAGE

CROSS-REFERENCE TO RELATED APPLICATIONS

The present application is based upon and claims the benefit of priority from the prior Japanese Patent Application No. 2022-069993 filed on Apr. 21, 2022, with the Japanese Patent Office, the entire contents of which are incorporated herein by reference.

FIELD

The disclosures herein relate to stems for semiconductor packages and semiconductor packages.

BACKGROUND

In a semiconductor package having a light emitting element, the light emitting element may generate a large amount of heat. In such a case, a cooling element for temperature adjustment may be provided, and the light emitting element may be mounted on a substrate that is for mounting an element and that is disposed on the cooling element.

In such a structure, use of the cooling element, which is relatively thick, results in signal leads being also correspondingly long. Transmission paths along the signal leads and extending to the light emitting element are thus long, with a resulting failure to achieve a desired characteristic impedance, which may deteriorate the transmission characteristics of the semiconductor package.

There may be a need to provide a stem for a semiconductor package capable of improving transmission characteristics when assembled into a semiconductor package.

RELATED ART DOCUMENT

Patent Document

[Patent Document 1] Japanese Patent No. 6794140

SUMMARY

According to an aspect of the embodiment, a stem for a semiconductor package includes an eyelet including a flat plate having a first surface and a second surface opposite to the first surface, a cavity opening to the first surface of the flat plate, and a metal block protruding from the second surface of the flat plate, and a lead extending through the flat plate from the first surface to the second surface, wherein a volume of the metal block is substantially the same as a volume of the cavity.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

Figure 1A:
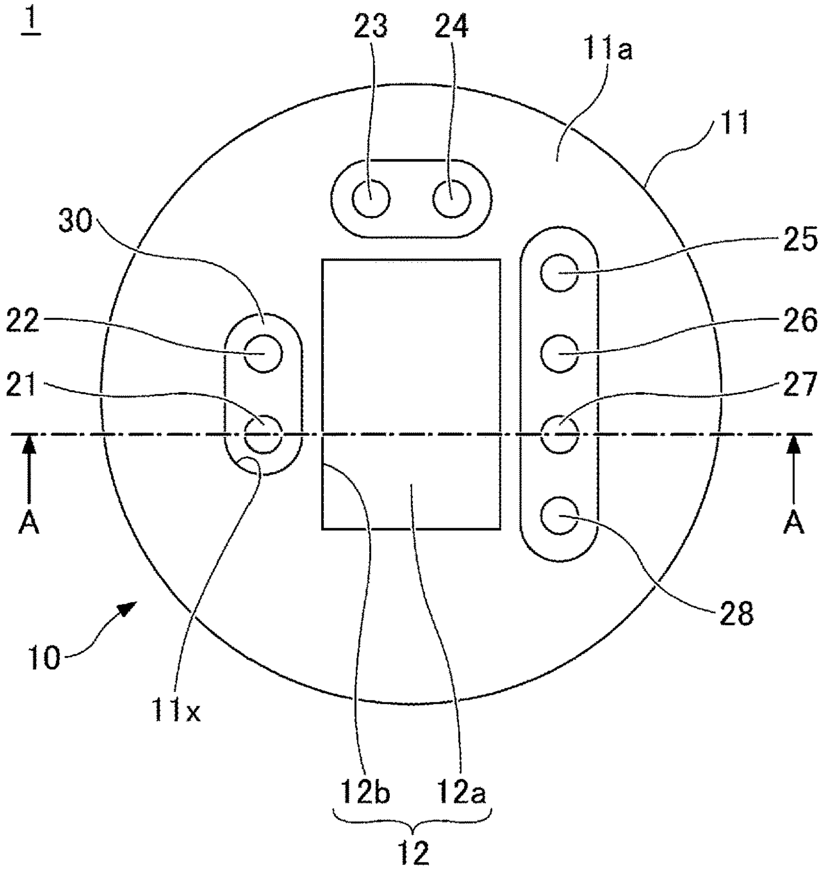
FIGS. 1A and 1B are drawings illustrating an example of a stem for a semiconductor package according to a first embodiment.

In the following, embodiments for carrying out the invention will be described with reference to the accompanying drawings. In the drawings, the same elements are denoted by the same reference numerals, and a duplicate description thereof may be omitted.

First Embodiment

Figure 1B:
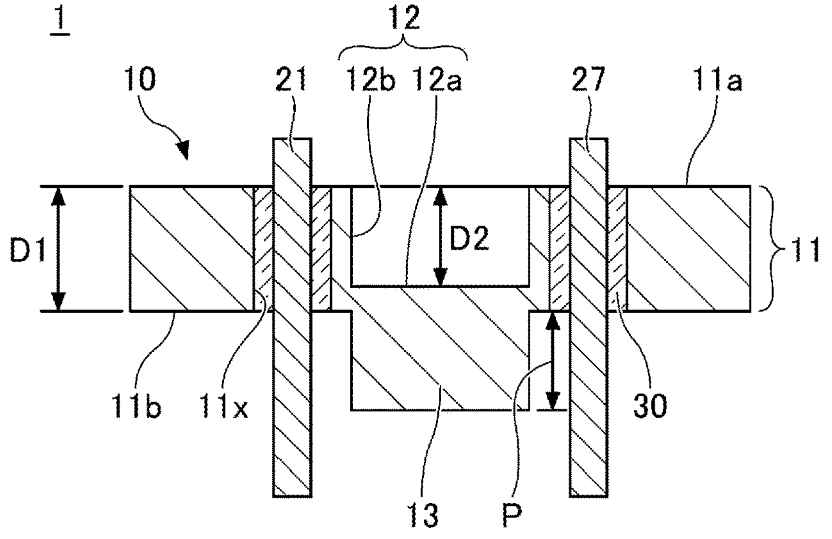

FIGS. 1A and 1B are drawings illustrating an example of a stem for a semiconductor package according to a first embodiment. FIG. 1A is a plan view, and FIG. 1B is a cross-sectional view taken along the line A-A in FIG. 1A.

Referring to FIGS. 1A and 1B, a stem 1 for a semiconductor package according to a first embodiment includes an eyelet 10, a first lead 21, a second lead 22, a third lead 23, a fourth lead 24, a fifth lead 25, a sixth lead 26, a seventh lead 27, an eighth lead 28, and sealing parts 30. The stem 1 for a semiconductor package can be used, for example, as a stem for optical communication.

The first lead 21, the second lead 22, the third lead 23, the fourth lead 24, the fifth lead 25, the sixth lead 26, the seventh lead 27, and the eighth lead 28 will be referred to simply as leads when there is no need to distinguish them.

The eyelet 10 includes a flat plate 11, a cavity 12, and a metal block 13.

The flat plate 11 is a disk-shaped member, and has a first surface 11*a* and a second surface 11*b* opposite to the first surface 11*a*. The first surface 11*a* and the second surface 11*b* are substantially parallel to each other. The diameters of the first surface 11*a* and the second surface 11*b* are not limited to a particular size, and may properly be determined according to the purpose. For example, the diameters are both 3.8 mm, or are both 5.6 mm. A distance D1 from the first surface 11*a* to the second surface 11*b*, namely, the height of the flat plate 11, is not limited to a particular length, and may properly be determined according to the purpose. The distance D1 is, for example, approximately greater than or equal to 1.0 mm and less than or equal to 2.0 mm. The flat plate 11 may be formed of a metal material such as iron, an iron-nickel alloy, Kovar, or copper. Gold plating or the like may be applied to the surfaces of the flat plate 11.

In the present application, the term "disk-shaped" refers to one having a substantially circular planar shape and a predetermined thickness. The relative size of the thickness to the diameter may be any size. A "disk-shaped" member may have a recess, a projection, a through-hole, or the like formed at some local position. In the present application, a plan view refers to the view of an object as viewed in the normal direction of the first surface 11*a* of the flat plate 11, and a plane shape refers to the shape of an object as viewed in the normal direction of the first surface 11*a* of the flat plate 11.

One or more cuts may be formed in the outer edge of the flat plate 11 as one or more recesses extending from the outer perimeter toward the center in a plan view. Each cut is, for example, a recess having a substantially triangular or rectangular plane shape. The cuts may be used, for example, for alignment purposes or the like when a semiconductor element is mounted on the stem 1 for a semiconductor package. Further, the cuts may be used, for example, to align the stem 1 for a semiconductor package in the rotational direction.

The cavity 12 opens to the first surface 11*a* of the flat plate 11. In other words, the cavity 12 is a recess extending from the first surface 11*a* of the flat plate 11 toward the second surface 11*b*. The cavity 12 has a bottom surface 12*a* and an inner side surface 12*b* connected to the perimeter of the bottom surface 12*a*. The cavity 12 is a space for housing a cooling element. The plane shape and volume of the cavity 12 may properly be determined in accordance with the cooling element to be disposed. In the example of FIGS. 1A and 1B, the plane shape of the cavity 12 is substantially rectangular, and the space defined by the bottom surface 12*a* and the inner side surface 12*b* of the cavity 12 is a substantially rectangular parallelepiped.

The inner side surface 12*b* of the cavity 12 is preferably substantially perpendicular to the first surface 11*a* of the flat plate 11. This makes it possible to reduce the area of the opening of the cavity 12 opening to the first surface 11*a* of the flat plate 11, which serves to avoid an excessively large area for housing the cooling element. As a result, the size of the flat plate 11 can be reduced. Here, the term "substantially perpendicular" means that the angle between two objects is 90±5 degrees. Further, the bottom surface 12*a* of the cavity 12 is preferably substantially parallel to the first surface 11*a* of the flat plate 11. This allows the cooling element to be readily disposed inside the cavity 12. Here, the term "substantially parallel" means that the angle between two objects is 180±5 degrees.

A distance D2 from the first surface 11*a* of the flat plate 11 to the bottom surface 12*a* of the cavity 12 is preferably half or more of the distance D1 from the first surface 11*a* to the second surface 11*b* of the flat plate 11. With this arrangement, a cooling element having a relatively large height can be disposed in the cavity 12. The distance D2 is more preferably two-thirds or more of the distance D1, and further preferably three quarters or more of the distance D1. The greater the distance D2, the higher the height of the cooling element that can be arranged in the cavity 12.

The metal block 13 protrudes downward from the second surface 11*b* of the flat plate 11. A length P of protrusion of the metal block 13 as measured from the second surface 11*b* of the flat plate 11 is substantially equal to the distance D2 from the first surface 11*a* of the flat plate 11 to the bottom surface 12*a* of the cavity 12. The length P of protrusion is, for example, within 20% above and below the distance D2. The volume of the metal block 13 is substantially the same as the volume of the cavity 12. The term "substantially the same" means that the volume of the metal block 13 is within 10% above and below the volume of the cavity 12. In a plan view, the metal block 13 substantially entirely overlaps the cavity 12. The term "substantially entirely overlap" means that 80% or more of the area of the metal block 13 overlaps the cavity 12 in a plan view.

Using metal as the material of the flat plate 11 makes it possible to form the metal block 13 integrally with the flat plate 11. The metal block 13 may be formed simultaneously with the flat plate 11 and the cavity 12 by pressing a metal plate. The metal plate may be pressed in such a manner as to provide the metal block 13 protruding on the lower surface of the metal plate, by which the material originally present at the position of the cavity 12 is pushed out from the lower surface of the metal plate. This arrangement readily forms the inner side surface 12*b* of the cavity 12 substantially perpendicular to the first surface 11*a* of the flat plate 11.

The metal block 13, instead of a lead, may be used for the ground. That is, since the metal block 13 is electrically connected to the flat plate 11, the flat plate 11 may be set to the ground potential by connecting the metal block 13 to the ground. This eliminates the need for a lead for GND.

Each lead extends from the first surface 11*a* to the second surface 11*b* of the flat plate 11. Specifically, each lead is inserted, with the longitudinal direction thereof oriented in the thickness direction of the flat plate 11, into a through-hole 11*x* extending through the flat plate 11 from the first surface 11*a* to the second surface 11*b*, and the surrounding gap is sealed with the sealing part 30. The sealing part 30 is made of, for example, an insulating material such as glass. As the glass, for example, a hard glass having a representative relative dielectric constant of about 5.5 or a soft glass having a representative relative dielectric constant of about 6.7 may be used. One lead may be disposed in one through-hole 11*x*, or a plurality of leads may be disposed in one through-hole 11*x*. In the example illustrated in FIGS. 1A and 1B, one through-hole 11*x* has two leads or four leads disposed therein.

The upper ends of the first lead 21 and the second lead 22 may be flush with the first surface 11*a* of the flat plate 11. Alternatively, the first lead 21 and the second lead 22 may protrude upward from the first surface 11*a* of the flat plate 11. In this case, the lengths of protrusion of the first lead 21 and the second lead 22 from the first surface 11*a* are preferably about 0.1 mm to 0.3 mm. The leads other than the first lead 21 and the second lead 22 may also be flush with the first surface 11*a* of the flat plate 11. Alternatively, the leads other than the first lead 21 and the second lead 22 may protrude upward from the first surface 11*a* of the flat plate 11.

Every lead protrudes downward from the second surface 11*b* of the flat plate 11. The lengths of protrusion of each lead from the second surface 11*b* of the flat plate 11 is, for example, about 6 to 10 mm. Each lead is made of, for example, a metal such as an iron-nickel alloy or Kovar, and gold plating or the like may be formed on the surface of each lead.

The first lead 21 and the second lead 22 are arranged next to each other and serve as a path for conducting a differential signal electrically connected to a light emitting element when the light emitting element is mounted on the stem 1 for a semiconductor package to provide a semiconductor package. The leads other than the first lead 21 and the second lead 22 serve as paths that conduct, for example, a signal electrically connected to a cooling element mounted on the stem 1 for a semiconductor package, a signal electrically connected to a temperature sensor mounted on the stem 1 for a semiconductor package, and the like. The number of leads is not limited, and may be increased or decreased as needed.

Figure 2A:
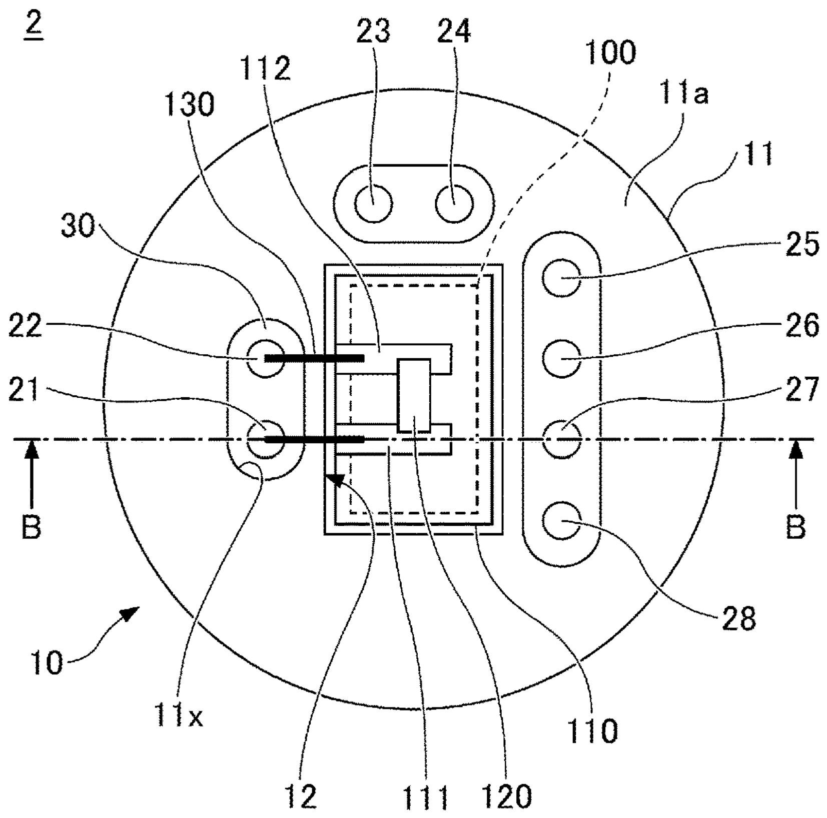
FIGS. 2A and 2B are drawings illustrating an example of a semiconductor package according to the first embodiment.
Figure 2B:
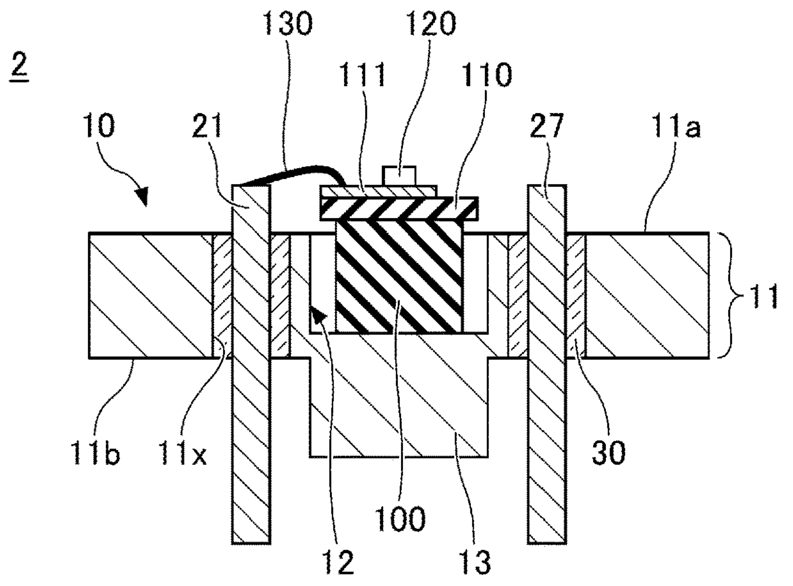

FIGS. 2A and 2B are drawings illustrating an example of a semiconductor package according to the first embodiment. FIG. 2A is a plan view, and FIG. 2B is a partial cross-sectional view taken along the line B-B in FIG. 2A.

Referring to FIGS. 2A and 2B, a semiconductor package 2 according to the first embodiment includes the stem 1 for a semiconductor package (see FIGS. 1A and 1B), a cooling element 100, an element mounting substrate 110, and a light emitting element 120. In the semiconductor package 2, a cap having a lens, a window, and the like for discharging light emitted from the light emitting element 120 may be fixed by resistance welding or the like to the stem 1 for a semiconductor package. Such a cap has a well-known structure, and illustration thereof is omitted. The cap is formed of a metal such as Kovar or stainless steel, for example, and hermetically encapsulates main components such as the light emitting element 120 of the stem 1 for a semiconductor package.

At least a part of the cooling element 100 is accommodated in the cavity 12. The entirety of the cooling element 100 may be accommodated in the cavity 12. The length of protrusion of the upper surface of the cooling element 100 from the first surface 11*a* of the flat plate 11 is preferably greater than or equal to 0.1 mm and less than or equal to 0.3 mm. This arrangement serves to reduce the length of protrusion of the first lead 21 and the second lead 22 from the first surface 11*a* of the flat plate 11, and is thus advantageous in terms of improving the transmission characteristics of the semiconductor package 2.

The cooling element 100 is fixed to the bottom surface 12*a* of the cavity 12 via an adhesive having high thermal conductivity, for example. The cooling element 100 is one that cools the light emitting element 120 that generates heat when emitting light, and is, for example, a Peltier element. The cooling capacity of the cooling element 100 is adjusted by changing an externally applied voltage. The height of the cooling element 100 is, for example, about 1 mm to 2 mm.

The element mounting substrate 110 is disposed on the cooling element 100. The element mounting substrate 110 is fixed on the cooling element 100 via an adhesive having high thermal conductivity, for example. The light emitting element 120 is mounted on the element mounting substrate 110. The light emitting element 120 is, for example, a laser diode chip with a wavelength of 1310 nm or the like.

Interconnects 111 and 112, which are electrically connected to the terminals of the light emitting element 120, are formed on the element mounting substrate 110. The interconnects 111 and 112 extend to that side of the element mounting substrate 110 which is alongside the first lead 21 and the second lead 22. The interconnect 111 is electrically connected to the first lead 21 via a line member 130. The interconnect 112 is electrically connected to the second lead 22 via another line member 130. The line members 130 may be, for example, bonding wires, but are not limited to a particular structure as long as they have a line shape.

The interconnects 111 and 112 are differential interconnects. A positive-phase signal is input into, for example, the interconnect 111 via the first lead 21 and the line member 130. A negative-phase signal obtained by inverting the positive-phase signal is input into the interconnect 112 via the second lead 22 and the line member 130.

It may be noted that the interconnects electrically connected to the terminals of the light emitting element 120 are not limited to differential interconnects. For example, a signal may be supplied from a lead having a single coaxial structure. The interconnects in this case are preferably configured as a coplanar structure having a signal line and GND interconnects situated on both sides of the signal line. These GND interconnects may be electrically connected to the back surface of the element mounting substrate 110 through vias or side-surface metallization.

Use of the stem 1 for a semiconductor package improves the transmission characteristics of a constructed semiconductor package. This will be described below with reference to a comparative example illustrated in FIG. 3.

Figure 3:
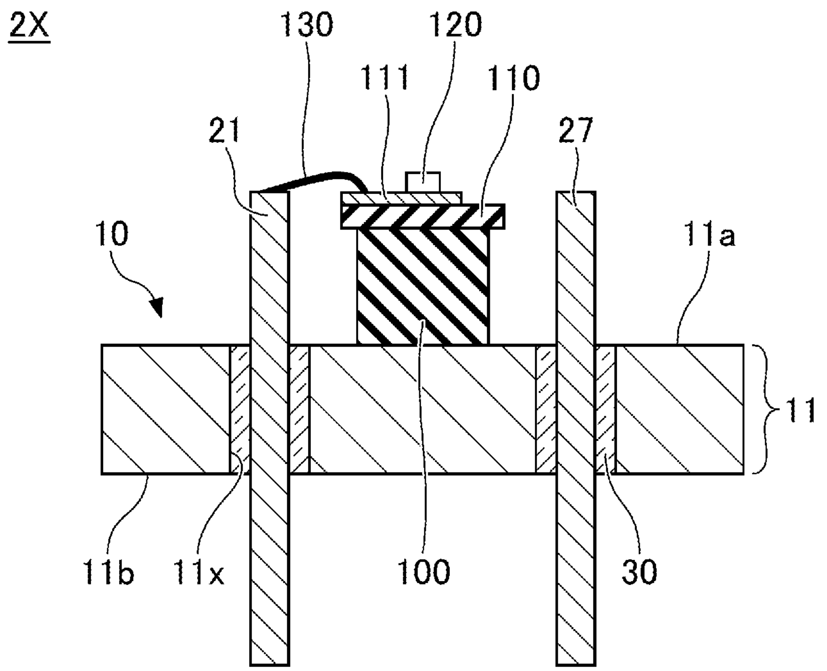
FIG. 3 is a cross-sectional view illustrating an example of a semiconductor package according to a comparative example.

FIG. 3 is a cross-sectional view illustrating an example of a semiconductor package according to a comparative example. Due to the fact that a plan view of this semiconductor package according to the comparative example is substantially the same as that of FIG. 1A, such a plan view is not provided. FIG. 3 corresponds to a cross section taken along the line A-A in FIG. 1A.

Referring to FIG. 3, a semiconductor package 2X according to the comparative example has an eyelet 10 formed only of a flat plate 11, and does not have either the cavity 12 or the metal block 13. The cooling element 100 is fixed to the first surface 11*a* of the flat plate 11. In this arrangement, the position of the element mounting substrate 110 disposed on the cooling element 100 is far away from the first surface 11*a* of the flat plate 11. The length of those portions of the first lead 21 and the second lead 22 which protrude from the first surface 11*a* such as to correspond in position to the element mounting substrate 110 is longer than that of the semiconductor package 2.

The portions of the first lead 21 and the second lead 22 serving as differential lines are surrounded and sealed by the sealing part 30 in the through-hole 11*x*, and have a structure that satisfies a predetermined differential impedance. In contrast, the other portions of the first lead 21 and the second lead 22 protruding from the first surface 11*a* create impedance mismatch, which adversely affects the transmission of high frequency signals. The semiconductor package 2X is configured such that the portions of the first lead 21 and the second lead 22 protruding from the first surface 11*a* are long, thereby being likely to cause impedance mismatch.

In contrast, the semiconductor package 2, in which the cooling element 100 is disposed in the cavity 12, is configured such that the lengths of those portions of the first lead 21 and the second lead 22 protruding from the first surface 11*a* are significantly reduced as compared with the semiconductor package 2X. The semiconductor package 2 is thus less likely to cause impedance mismatch, and allows the characteristic impedance to be easily matched to reduce reflection loss. As a result, the transmission characteristics of the semiconductor package 2 is improved. That is, the semiconductor package 2 enables high-quality transmission of a high-frequency signal to the light emitting element 120.

First Variation of First Embodiment

A first variation of the first embodiment is directed to a configuration in which a relay substrate is provided in a stem for a semiconductor package. In the first variation of the first embodiment, a description of the same components as those in the above-described embodiment may be omitted.

Figure 4A:
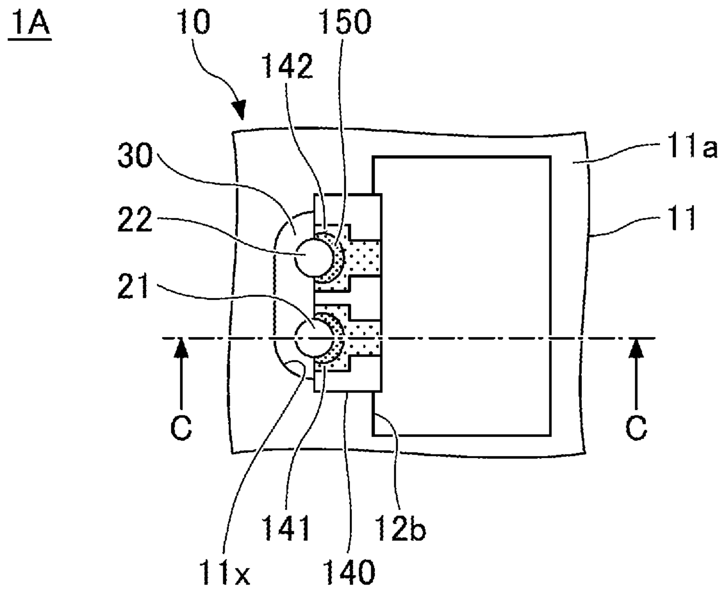
FIGS. 4A and 4B are drawings illustrating an example of a stem for a semiconductor package according to a variation of the first embodiment.
Figure 4B:
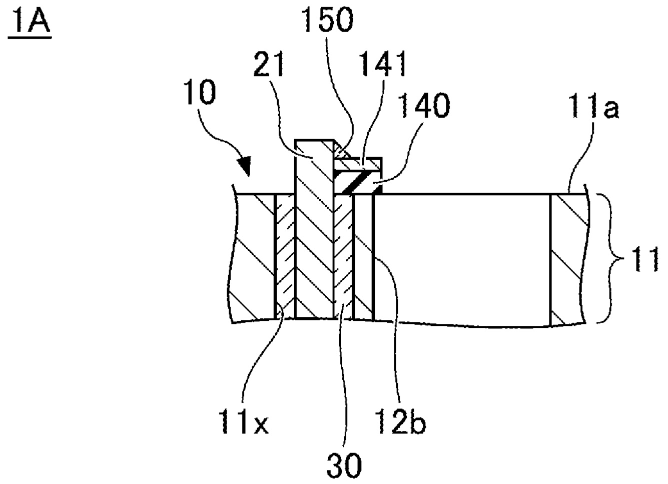

FIGS. 4A and 4B are drawings illustrating an example of a stem for a semiconductor package according to a first variation of the first embodiment. FIG. 4A is a partial plan view, and FIG. 4B is a partial cross-sectional view taken along the line C-C in FIG. 4A.

Referring to FIGS. 4A and 4B, a stem 1A for a semiconductor package according to the first variation of the first embodiment differs from the stem 1 for a semiconductor package (see FIGS. 1A and 1B) in that a relay substrate 140 disposed on the first surface 11*a* of the flat plate 11 is additionally provided.

The relay substrate 140 is fixed to the first surface 11*a* of the flat plate 11 with, for example, solder such as AuSn, an adhesive, or the like. Relay interconnects 141 and 142 are formed on the upper surface of the relay substrate 140. The relay interconnect 141 is electrically connected to the first lead 21 with a conductive bonding material 150 (e.g., solder or the like). The relay interconnect 142 is electrically connected to the second lead 22 with a conductive bonding material 150 (e.g., solder or the like). The relay substrate 140 may be implemented as, for example, a glass substrate or a ceramic substrate. The relay substrate 140 may alternatively be implemented as a resin substrate (e.g., glass epoxy substrate or the like).

Figure 5A:
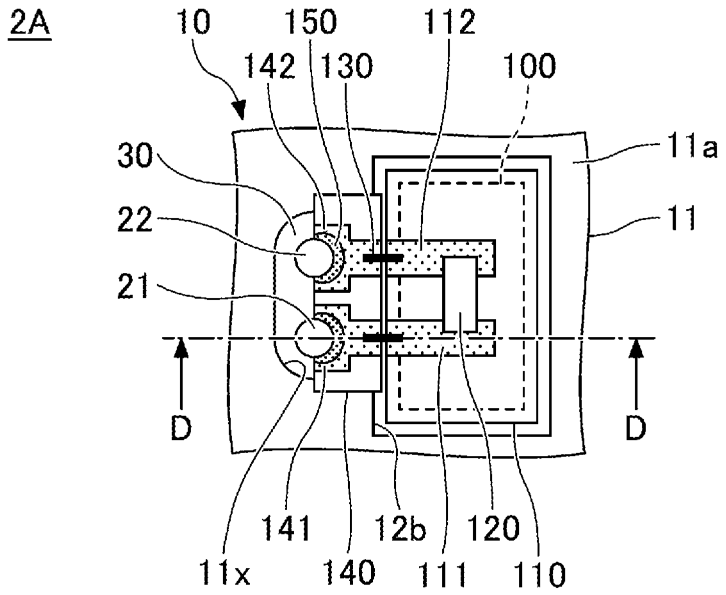
FIGS. 5A and 5B are drawings illustrating an example of a semiconductor package according to a variation of the first embodiment.
Figure 5B:
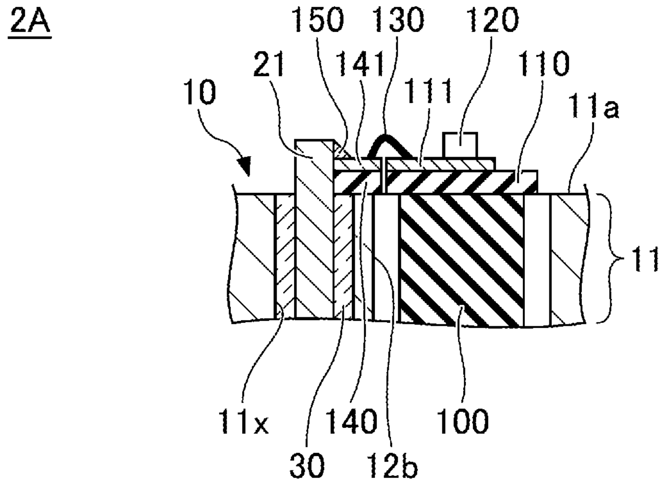

FIGS. 5A and 5B are drawings illustrating a semiconductor package according to a first variation of the first embodiment. FIG. 5A is a partial plan view, and FIG. 5B is a partial cross-sectional view taken along the line D-D in FIG. 5A.

Referring to FIGS. 5A and 5B, a semiconductor package 2A according to the first variation of the first embodiment includes the relay substrate 140 as in FIGS. 4A and 4B. The interconnect 111 of the element mounting substrate 110 is electrically connected to the relay interconnect 141 of the relay substrate 140 via the line member 130. Further, the interconnect 112 of the element mounting substrate 110 is electrically connected to the relay interconnect 142 of the relay substrate 140 via the line member 130.

By providing the relay substrate 140, it is possible to realize desired impedance and to change the pitch of differential lines. With this arrangement, a smaller loss is incurred when connecting the first lead 21 and the second lead 22 to the respective interconnects 111 and 112 of the element mounting substrate 110.

In addition, the semiconductor package 2A is configured such that the line members 130 are shorter than those of the semiconductor package 2, thereby realizing the reduction of parasitic inductance. This is an additional advantage in terms of transmitting high-frequency signals. The upper surface of the element mounting substrate 110 and the upper surface of the relay substrate 140 are preferably coplanar. That is, with the element mounting substrate 110 and the relay substrate 140 having the same thickness, the upper surface of the cooling element 100 is preferably coplanar with the first surface 11*a* of the flat plate 11. This arrangement further shortens the line members 130.

Simulation

In the following, results of simulations performed on the semiconductor packages 2A and 2X will be described. Analysis software, ANSYS Electromagnetics Suite 2019 R3, is used for simulation.

The simulation conditions are such that the length of protrusion of the first lead 21 and the second lead 22 from the first surface 11*a* is 0.4 mm in the semiconductor package 2A, and the length of protrusion of the first lead 21 and the second lead 22 from the first surface 11*a* is 1.0 mm in the semiconductor package 2X. In the semiconductor package 2A, the relay substrate 140 is 0.2 mm thick, and the first lead 21 and the second lead 22 protrude 0.2 mm from the upper surface of the relay substrate 140.

Figure 6:
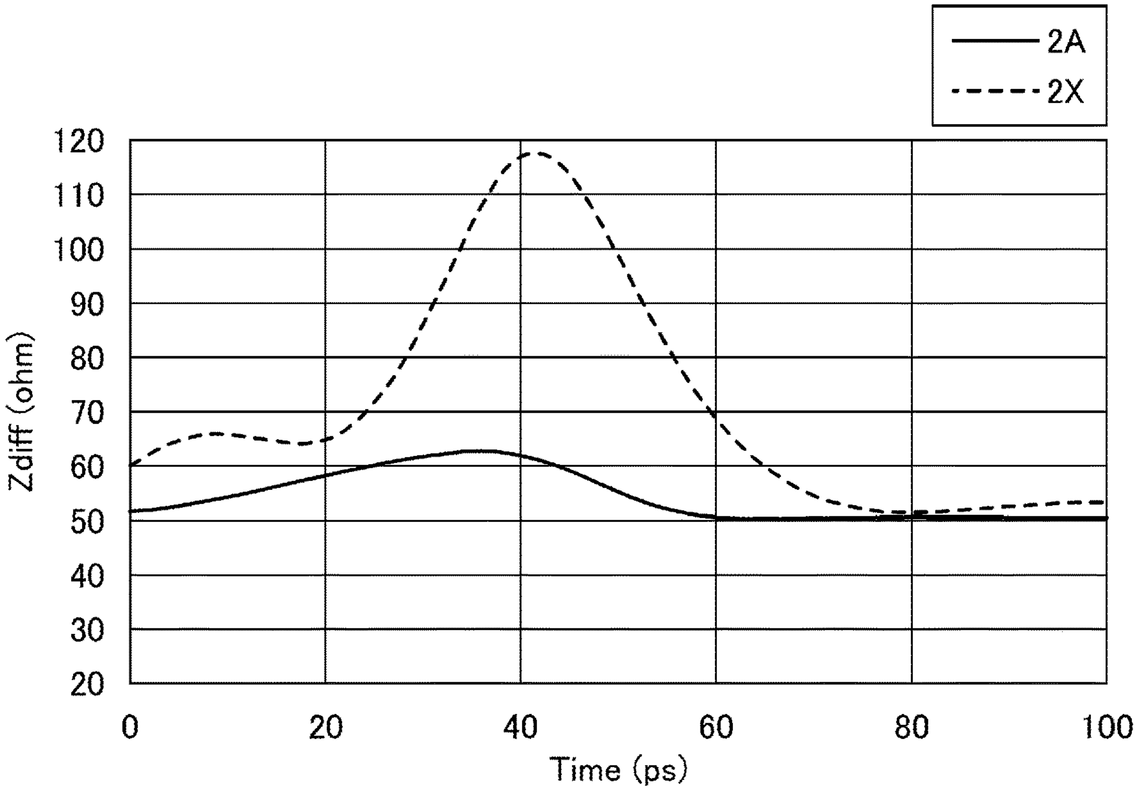
FIG. 6 is a drawing illustrating the results of simulation.

The characteristic impedances (Ω) of the semiconductor packages 2A and 2X are calculated, and the results of calculation are illustrated in FIG. 6. As illustrated in FIG. 6, the characteristic impedance of the semiconductor package 2X is about 120Ω around 40 ps. In contrast, the semiconductor package 2A has a characteristic impedance of about 50Ω throughout the entire range, which indicates the fact that a nearly ideal characteristic impedance is obtained.

Figure 7:
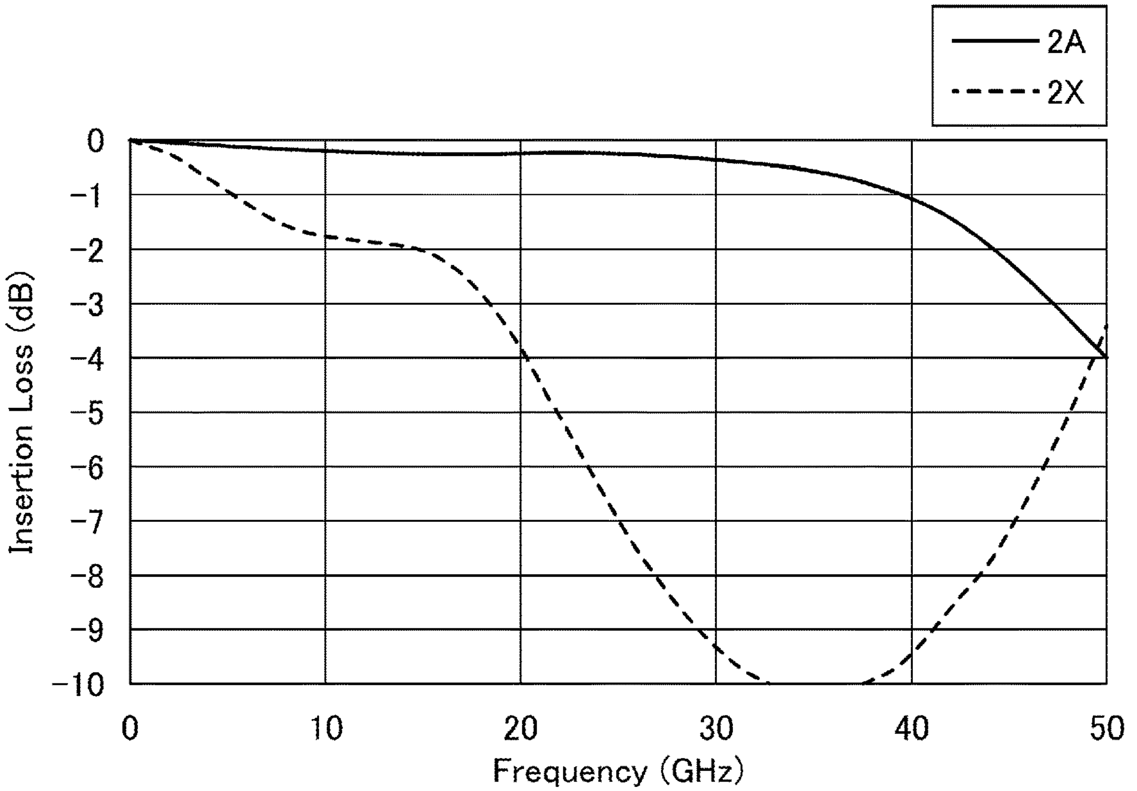
FIG. 7 is a drawing illustrating the results of the simulation.

The insertion losses (dB) of the semiconductor packages 2A and 2X are calculated, and the results of calculation are illustrated in FIG. 7. As is shown in FIG. 7, the semiconductor package 2A has significantly improved insertion loss (dB) around a range from about 0 to about 50 GHz, compared with the semiconductor package 2X.

Figure 8:
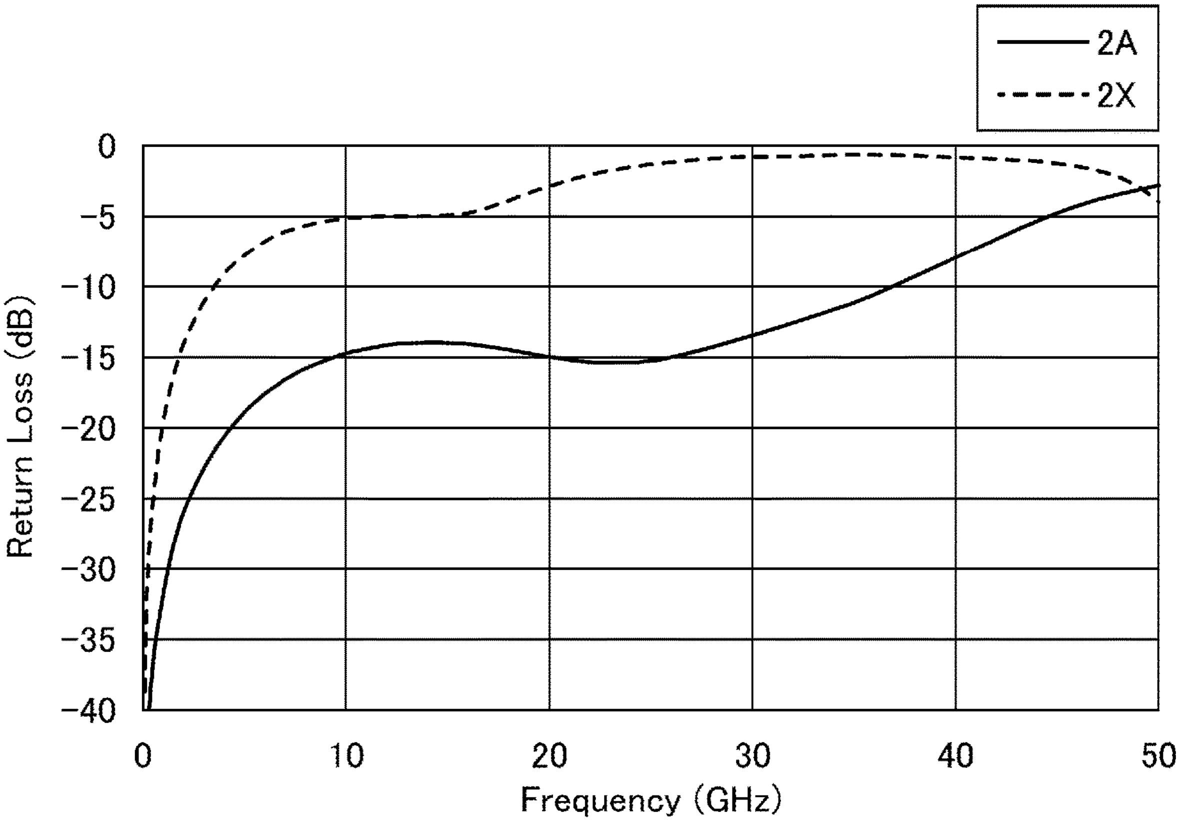
FIG. 8 is a drawing illustrating the results of the simulation.

The return losses (dB) of the semiconductor packages 2A and 2X are calculated, and the results of calculation are illustrated in FIG. 8. As is shown in FIG. 8, the semiconductor package 2A has a significantly improved return loss (dB) around a range from about 10 GHz to 50 GHz, compared with the semiconductor package 2X.

In addition, the results shown in FIGS. 7 and 8 indicate that while the semiconductor package 2X allows only the signals of about several GHz to be transmitted, the semiconductor package 2A allows also the signals of about 30 GHz to 40 GHz to be satisfactorily transmitted.

According to at least one embodiment, it is possible to provide a stem for a semiconductor package that is capable of improving transmission characteristics when assembled into a semiconductor package.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A stem for a semiconductor package, comprising:

an eyelet including a flat plate having a first surface and a second surface opposite to the first surface, a cavity opening to the first surface of the flat plate, and a metal block protruding from the second surface of the flat plate; and a lead extending through the flat plate from the first surface to the second surface, wherein a volume of the metal block is substantially the same as a volume of the cavity and wherein the cavity has a bottom surface without penetrating the flat plate, and a vertical distance from the first surface to the bottom surface of the cavity is at least half of a vertical distance from the first surface to the second surface.

2. The stem for a semiconductor package as claimed in claim 1, wherein in a plan view, the metal block overlaps with substantially an entirety of the cavity.

3. The stem for a semiconductor package as claimed in claim 1, wherein the flat plate is made of metal, and the metal block is seamless and continuous with the flat plate.

4. The stem for a semiconductor package as claimed in claim 1, wherein an inner side surface of the cavity is substantially perpendicular to the first surface.

5. The stem for a semiconductor package as claimed in claim 1, further comprising:

a relay substrate disposed on the first surface; and a relay interconnect formed on the relay substrate, wherein the relay interconnect is electrically connected to the lead.

6. A semiconductor package comprising:

the stem for a semiconductor package of claim 1;

a cooling element at least a part of which is accommodated in the cavity;

a substrate disposed on the cooling element;

a light emitting element mounted on the substrate;

an interconnect electrically connected to the light emitting element and formed on the substrate; and a line member electrically connecting the interconnect and the lead.

7. A semiconductor package comprising:

the stem for a semiconductor package of claim 5; and a cooling element disposed on a bottom surface of the cavity;

a main substrate disposed on the cooling element;

a light emitting element mounted on the main substrate;

a main interconnect electrically connected to the light emitting element and formed on the main substrate; and a line member electrically connecting the main interconnect and the relay interconnect.

8. The semiconductor package as claimed in claim 7, wherein an upper surface of the main substrate and an upper surface of the relay substrate are coplanar.

9. The semiconductor package as claimed in claim 6, wherein a length of protrusion of the cooling element from the first surface is greater than or equal to 0.1 mm and less than or equal to 0.3 mm.

* * * * *